(12) United States Patent
Mosley et al.

(10) Patent No.: US 9,080,068 B2
(45) Date of Patent: *Jul. 14, 2015

(54) GALLIUM FORMULATED INK AND METHODS OF MAKING AND USING SAME

(71) Applicant: Rohm and Haas Electronic Materials LLC, Marlborough, MA (US)

(72) Inventors: David Mosley, Philadelphia, PA (US); David Thorsen, Pitman, NJ (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 418 days.

This patent is subject to a terminal disclaimer.

(21) Appl. No.: 13/679,519

(22) Filed: Nov. 16, 2012

(65) Prior Publication Data

US 2013/0078384 A1    Mar. 28, 2013

Related U.S. Application Data

(62) Division of application No. 13/030,175, filed on Feb. 18, 2011, now Pat. No. 8,343,267.

(51) Int. Cl.

| | |
|---|---|
| *H01L 31/00* | (2006.01) |
| *C09D 11/03* | (2014.01) |
| *C09D 11/52* | (2014.01) |
| *H01L 21/02* | (2006.01) |
| *H01L 31/032* | (2006.01) |
| *H01L 45/00* | (2006.01) |

(52) U.S. Cl.
CPC ............... *C09D 11/03* (2013.01); *C09D 11/52* (2013.01); *H01L 21/02422* (2013.01); *H01L 21/02568* (2013.01); *H01L 21/02628* (2013.01); *H01L 31/0322* (2013.01); *H01L 45/1608* (2013.01); *H01L 45/141* (2013.01); *Y02E 10/541* (2013.01)

(58) Field of Classification Search
CPC ................................................... H01L 21/02436
See application file for complete search history.

(56) References Cited

U.S. PATENT DOCUMENTS

| | | | |
|---|---|---|---|
| 8,282,995 B2 * | 10/2012 | Calzia et al. ................ | 427/380 |
| 2009/0260670 A1 * | 10/2009 | Li ................................. | 136/244 |
| 2012/0082794 A1 * | 4/2012 | Calzia et al. ................ | 427/380 |

\* cited by examiner

*Primary Examiner* — Robert Vetere
(74) *Attorney, Agent, or Firm* — Thomas S. Deibert

(57) ABSTRACT

A method for depositing a Group 1b/gallium/(optional indium)/Group 6a material using a gallium formulated ink, comprising, as initial components: (a) a Group 1b/gallium/(optional indium)/Group 6a system which comprises a combination of, as initial components: a gallium component; a selenium component; an organic chalcogenide component; a Group 1b component comprising, as an initial component, at least one of $CuCl_2$ and $Cu_2O$; optionally, a bidentate thiol component; optionally, an indium component; and, (b) a liquid carrier component; depositing the gallium formulated ink on the substrate; heating the deposited gallium formulated ink to eliminate the gallium carrier, the first liquid carrier, the second liquid carrier and the, optional, third liquid carrier leaving a Group 1b/gallium/(optional indium)/Group 6a material on the substrate; and, optionally, annealing the Group 1b/gallium/(optional indium)/Group 6a material.

8 Claims, No Drawings

_US 9,080,068 B2_

GALLIUM FORMULATED INK AND METHODS OF MAKING AND USING SAME

The present invention relates to a gallium formulated ink, to a method of preparing a gallium formulated ink and to a method of using the gallium formulated ink to deposit a Group 1b/gallium/(optional indium)/Group 6a material on a substrate.

The fabrication of thin films of Group 1b/Group 3a/Group 6a material have been studied extensively over the past two decades for use in a number of potential applications, including, for example, switching devices, photovoltaics, nonlinear optics, ionic batteries and high density phase change data storage devices.

One very promising application for Group 1b/Group 3a/Group 6a materials is in the manufacture of photovoltaic cells for the conversion of sunlight into electricity. In particular, the manufacture of photovoltaic cells based on Group 1b-3a-6a mixed-metal chalcogenide materials, including for example, copper-indium-diselenide ($CuInSe_2$), copper-gallium-diselenide ($CuGaSe_2$) and copper-indium-gallium-diselenide ($CuIn_{1-x}Ga_xSe_2$), are of considerable interest because of their high solar energy to electrical energy conversion efficiencies. The Group 1b-3a-6a mixed metal chalcogenide semiconductors are sometimes referred to generically as CIGS materials. Conventional CIGS solar cells include a back electrode such as a layer of molybdenum, a CIGS absorber layer, a CdS junction partner layer, an optional transparent buffer layer such as a zinc oxide, and a transparent conductive oxide layer electrode (e.g., aluminum doped $ZnO_x$, indium tin oxide, $SnO_2$); wherein the molybdenum layer is deposited over a substrate, the CIGS absorber layer is interposed between the molybdenum layer and the CdS junction partner and the CdS junction partner is interposed between the CIGS absorber layer and the transparent conductive oxide layer electrode.

One challenge for the promising use of deposited films of Group 1b/Group 3a/Group 6a materials is the development of cost-effective manufacturing techniques. Conventional methods for depositing Group 1b/Group 3a/Group 6a materials typically involve the use of vacuum based processes, including, for example, vacuum evaporation, sputtering and chemical vapor deposition (e.g., metal-organic chemical vapor deposition). Such deposition techniques tend to exhibit low throughput capabilities and high cost. To facilitate the large scale, high throughput, low cost, manufacture of systems incorporating the use of deposited Group 1b/Group 3a/Group 6a materials, it would be desirable to provide liquid based deposition techniques.

A method for the liquid deposition of a semiconductor precursor film is disclosed in U.S. Pat. No. 6,126,740 to Schulz et al. Schulz et al. disclose a colloidal suspension comprising metal chalcogenide nanoparticles and a volatile capping agent, wherein the colloidal suspension is made by the reaction of a metal salt with a chalcogenide salt in an organic solvent to precipitate a metal chalcogenide, recovery of the metal chalcogenide precipitate, and mixing of the metal chalcogenide precipitate with a volatile capping agent in a nonaqueous organic solvent. Schulz et al. further disclose that the colloidal suspension can be spray deposited onto a substrate to produce a semiconductor precursor film. Schulz et al. disclose that particular preferred metals for use in its colloidal suspension and method of use are copper, indium, gallium and cadmium.

One liquid deposition method for depositing selenium in the manufacture of a CIGS material is disclosed by Mitzi, et al. in _A High-Efficiency Solution-Deposited Thin-Film Photovoltaic Device_, ADVANCED MATERIALS, vol. 20, pp. 3657-62 (2008)("Mitzi I"). Mitzi I discloses the use of a selenium ink comprising hydrazine, inter alia, as a liquid vehicle for depositing selenium in the manufacture of a thin film CIGS layer. Hydrazine, however, is a highly toxic and explosive material. Accordingly, the Mitzi I process has limited value for use in the large scale manufacture of selenium containing semiconductor devices.

An alternative to the hydrazine containing selenium ink described in Mitzi I is disclosed by Mitzi, et al. in _Low-Voltage Transistor Employing a High-Mobility Spin-Coated Chalcogenide Semiconductor_, ADVANCED MATERIALS vol. 17, pp. 1285-89 (2005)("Mitzi II"). Mitzi II discloses the use of a hydrazinium precursor material for deposition of indium selenide to form an indium selenide channel of a thin film transistor. Mitzi II further asserts that its hydrazinium approach is likely extendable to other chalcogenides besides $SnS_{2-x}Se_x$, $GeSe_2$, and $In_2Se_3$ systems.

The hydrazinium precursor materials disclosed by Mitzi, et al. remove hydrazine from the manufacturing step to produce semiconductor films. Notwithstanding, Mitzi, et al. do not eliminate the need for hydrazine. Rather, Mitzi, et al. still utilize hydrazine in the preparation of the hydrazinium precursor materials. Moreover, hydrazinium ion precursors pose a significant explosion risk, as documented by Eckart W. Schmidt in his book, _Hydrazine and Its Derivatives: Preparation, Properties, and Applications_, JOHN WILEY & SONS pp 392-401 (1984). The presence of numerous metal ions exacerbates the risk of hydrazinium explosion or detonation. This can be a problem because residual hydrazinium salts may accumulate in process equipment during manufacture, presenting an unacceptable safety risk.

Accordingly, there remains a need for a liquid deposition method for use in the manufacture of systems incorporating CIGS semiconductors (e.g., switching devices, photovoltaics, nonlinear optics, ionic batteries and high density phase change data storage devices). In particular, there remains a need for a gallium formulated ink that facilitates the deposition of a Group 1b/gallium/(optionally indium)/Group 6a material, preferably wherein the Gallium ink formulation is hydrazine and hydrazinium free.

The present invention provides a gallium formulated ink, comprising: (a) a Group 1b/gallium/(optional indium)/Group 6a system which comprises a combination of, as initial components: a gallium component, comprising, as initial components: gallium, a stabilizing component, an additive and a gallium carrier; a selenium component; an organic chalcogenide component: comprising at least one organic chalcogenide having a formula selected from RZ—Z'R' and $R^2$—SH; wherein Z and Z' are independently selected from sulfur, selenium and tellurium; wherein R is selected from H, $C_{1-20}$ alkyl group, a $C_{6-20}$ aryl group, a $C_{1-20}$ hydroxyalkyl group, a $C_{1-20}$ mercaptoalkyl group and an ether group; wherein R' and $R^2$ are selected from a $C_{1-20}$ alkyl group, a $C_{6-20}$ aryl group, a $C_{1-20}$ hydroxyalkyl group, a $C_{1-20}$ mercaptoalkyl group and an ether group; a Group 1b component comprising, as an initial component, at least one of $CuCl_2$ and $Cu_2O$; optionally, a bidentate thiol component; optionally, an indium component; and, (b) a liquid carrier component; wherein the stabilizing component is selected from the group consisting of 1,3-propanedithiol, beta-mercaptoethanol, analogs thereof and mixtures thereof; wherein the additive is selected from the group consisting of pyrazine; 2-methylpyrazine; 3-methylpyrazole; methyl 2-pyrazinecarboxylate; pyrazole; praxadine; pyrazine carboxamide; pyrazine carbonitrile; 2,5-dimethylpyrazine; 2,3,5,6-tetramethylpyrazine; 2-aminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedicarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group; tetrazole; tetrazole substituted with a $C_{1-5}$ alkyl group; 1,5-diazabicyclo[4.3.0]non-5-ene; and 1,8-diazabicyclo[5.4.0]undec-7-ene; wherein the gallium carrier is selected from ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1-amino-2-propanol; 1,3-diaminopropane; 1,2-diaminopropane; 1,2-diaminocyclohexane; pyridine; pyrrolidine; 1-methylimidazole; tetramethylguanidine; 2-methylpyrazine and mixtures thereof; and, wherein the Group 1b/gallium/(optional indium)/Group 6a system is stably dispersed in the liquid carrier component.

The present invention provides a method of preparing a gallium formulated ink according to claim 1, comprising: providing a gallium; providing a stabilizing component, wherein the stabilizing component is selected from 1,3-propanedithiol, beta-mercaptoethanol, analogs thereof and mixtures thereof; providing an additive, wherein the additive is selected from the group consisting of pyrazine; 2-methylpyrazine; 3-methylpyrazole; methyl 2-pyrazinecarboxylate; pyrazole; praxadine; pyrazine carboxamide; pyrazine carbonitrile; 2,5-dimethylpyrazine; 2,3,5,6-tetramethylpyrazine; 2-aminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedicarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group; tetrazole; tetrazole substituted with a $C_{1-5}$ alkyl group; 1,5-diazabicyclo[4.3.0]non-5-ene; and 1,8-diazabicyclo[5.4.0]undec-7-ene; providing a gallium carrier, wherein the gallium carrier is selected from ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1-amino-2-propanol; 1,3-diaminopropane; 1,2-diaminopropane; 1,2-diaminocyclohexane; pyridine; pyrrolidine; 1-methylimidazole; tetramethylguanidine; 2-methylpyrazine and mixtures thereof; providing a selenium; providing an organic chalcogenide component, comprising: a first organic chalcogenide and, optionally, a second organic chalcogenide both having a formula independently selected from RZ—Z'R' and $R^2$—SH; wherein Z and Z' are independently selected from sulfur, selenium and tellurium; wherein R is selected from H, $C_{1-20}$ alkyl group, a $C_{6-20}$ aryl group, a $C_{1-20}$ hydroxyalkyl group, a $C_{1-20}$ mercaptoalkyl group and an ether group; wherein R' and $R^2$ are selected from a $C_{1-20}$ alkyl group, a $C_{6-20}$ aryl group, a $C_{1-20}$ hydroxyalkyl group, a $C_{1-20}$ mercaptoalkyl group and an ether group; providing a Group 1b component comprising, as an initial component: at least one of $CuCl_2$ and $Cu_2O$; providing a Group 1b ligand component; optionally, providing indium; providing a liquid carrier component, comprising: a first liquid carrier, a second liquid carrier and, optionally, a third liquid carrier; combining the gallium, the stabilizing component, the additive and the gallium carrier to produce a gallium component; combining the selenium, the first organic chalcogenide and the first liquid carrier; heating the combination with agitation to produce a combined selenium/organic chalcogenide component; combining the Group 1b component, the Group 1b ligand component and the second liquid carrier to produce a Group 1b material/ligand component; optionally, combining the indium, the second organic chalcogenide and the third liquid carrier to produce an optional indium/organic chalcogenide component; combining the gallium component, the combined selenium/organic chalcogenide component, the Group 1b material/ligand component and the optional indium/organic chalcogenide component to form the gallium formulated ink; wherein the gallium formulated ink is a stable dispersion; and, wherein the first liquid carrier, the second liquid carrier and the optional third liquid carrier are the same or are miscible together with the gallium carrier.

The present invention provides a method for depositing a Group 1b/gallium/(optional indium)/Group 6a material on a substrate, comprising: providing a substrate; providing a gallium formulated ink of the present invention; depositing the gallium formulated ink on the substrate; heating the deposited gallium formulated ink to eliminate the gallium carrier, the first liquid carrier, the second liquid carrier and the, optional, third liquid carrier leaving a Group 1b/gallium/(optional indium)/Group 6a material on the substrate; and, optionally, annealing the Group 1b/gallium/(optional indium)/Group 6a material; wherein the Group 1b/gallium/(optional indium)/Group 6a material is according to the formula $Na_L Cu_m Ga_d In_{(1-d)} S_{(2+e)(1-f)} Se_{(2+e)f}$, wherein $0 \leq L \leq 0.25$, $0.25 \leq m \leq 1.5$, $0 \leq d \leq 1$, $-0.2 \leq e \leq 0.5$, $0 \leq f \leq 1$; wherein $0.5 \leq (L+m) \leq 1.5$ and $1.8 \leq \{(2+e)f+(2+e)(1-f)\} \leq 2.5$.

DETAILED DESCRIPTION

The term "stable" as used herein and in the appended claims in reference to the gallium formulated ink means that the product formed by the combination of the gallium component, the selenium component, the organic chalcogenide component, the Group 1b component, the Group 1b ligand component and the optional indium component in the liquid carrier component does not form a precipitate during storage of the gallium formulated ink at 22° C. under nitrogen for a period of fifteen (15) minutes.

The term "storage stable" as used herein and in the appended claims in reference to the gallium formulated ink means that the gallium formulated ink does not form a precipitate during storage of the gallium formulated ink at 22° C. under nitrogen for a period of twenty four (24) hours.

The term "extended stability" as used herein and in the appended claims in reference to the gallium formulated ink means that the gallium ink does not form a precipitate during storage of the gallium formulated ink at 22° C. under nitrogen for a period of seven (7) days.

The term "hydrazine free" as used herein and in the appended claims in reference to the gallium formulated ink means that the gallium formulated ink contains <100 ppm hydrazine.

The term "hydrazinium free or $(N_2H_5)^+$ free" as used herein and in the appended claims in reference to the gallium formulated ink means that the gallium formulated ink contains <100 ppm hydrazinium complexed with selenium.

The present invention relates to a gallium formulated ink, the preparation of the gallium formulated ink and the use of the gallium formulated ink in the manufacture of gallium/Group 1b/(optional indium)/Group 6a containing devices such as thin film transistors (TFTs), light emitting diodes (LEDs); phase change alloys for use in memory devices; and photo responsive devices {e.g., electrophotography (e.g., laser printers and copiers), rectifiers, photographic exposure meters and photovoltaic cells}. The following detailed description focuses on the use of the gallium/Group 1b/(optional indium)/Group 6a ink of the present invention in the preparation of CIGS materials designed for use in photovoltaic cells.

Preferably, the gallium formulated ink of the present invention is stable. More preferably, the gallium formulated ink of the present invention is storage stable. Most preferably, the gallium formulated ink of the present invention exhibits extended stability.

Preferably, the gallium formulated ink of the present invention is hydrazine free and hydrazinium free.

Preferably, the gallium used in the gallium formulated ink of the present invention is gallium shot or gallium ingot.

Preferably, the stabilizing component used in the gallium formulated ink of the present invention is selected from the group consisting of 1,3-propanedithiol, beta-mercaptoethanol, analogs thereof and mixtures thereof. More preferably, the stabilizing component is selected from the group consisting of 1,3-propanedithiol, beta-mercaptoethanol and mixtures thereof. Still more preferably, the stabilizing component is selected from the group consisting of 1,3-propanedithiol and beta-mercaptoethanol. Most preferably, the stabilizing component is 1,3-propanedithiol.

The additive used in the gallium formulated ink of the present invention is preferably selected from the group consisting of pyrazine; 2-methylpyrazine; 3-methylpyrazole; methyl 2-pyrazinecarboxylate; pyrazole; praxadine; pyrazine carboxamide; pyrazine carbonitrile; 2,5-dimethylpyrazine; 2,3,5,6-tetramethylpyrazine; 2-aminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedicarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group (e.g., 1-methylimidazole); tetrazole; tetrazole substituted with a $C_{1-5}$ alkyl group; 1,5-diazabicyclo[4.3.0]non-5-ene; and 1,8-diazabicyclo[5.4.0]undec-7-ene. Preferably, the additive is selected from the group consisting of 1,5-diazabicyclo[4.3.0]non-5-ene; 1,8-diazabicyclo[5.4.0]undec-7-ene; pyrrolidino-1-cyclohexene; 1-methylimidazole; pyrazine and 2-methylpyrazine. One of ordinary skill in the art will recognize that Stork enamines are formed from a secondary amine (like pyrrolidine) and a ketone. Commercially available Stork enamines include pyrrolidino-1-cyclohexene and pyrrolidino-1-cyclopentene. Note that Stork enamines can be made in situ by the reaction of a secondary amine and a ketone under dehydrating conditions.

The gallium carrier used in the gallium formulated ink of the present invention can be any solvent or miscible mixtures of solvents in which gallium is stably dispersible in the presence of the additive. Preferably, the liquid carrier used is selected from amines, ethers, polyethers, amide solvents (e.g., dimethylformamide, dimethylacetamide), N-methylpyrrolidone, keto-solvents (e.g., methylisobutylketone), aryl solvents (e.g., toluene), cresols, xylene and miscible mixtures thereof. Optionally, the liquid carrier used is selected from ethers, polyethers, amide solvents (e.g., dimethylformamide, dimethylacetamide), N-methylpyrrolidone, keto-solvents (e.g., methylisobutylketone), aryl solvents (e.g., toluene), cresols, xylene and miscible mixtures thereof. Optionally, the gallium carrier is selected from a nitrogen containing solvent and a miscible mixture of nitrogen containing solvents. More preferably, the gallium carrier used comprises a liquid amine having a formula $NR_3$, wherein each R is independently selected from a H, a $C_{1-10}$ alkyl group, a $C_{6-10}$ aryl group, a $C_{3-10}$ aminocycloalkyl group (e.g., 1,2-diamino cyclohexyl) and a $C_{1-10}$ aminoalkyl group. Still more preferably, the gallium carrier used in the gallium component of the present invention is selected ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1-amino-2-propanol; 1,3-diaminopropane; 1,2-diaminopropane; 1,2-diaminocyclohexane; pyridine; pyrrolidine; 1-methylimidazole; tetramethylguanidine; 2-methylpyrazine and mixtures thereof. Most preferably, the gallium carrier is selected from the group consisting of 1,3-diaminopropane; 1,2-diaminopropane; 2-methylpyrazine and mixtures thereof.

The selenium component used, as an initial component, in the gallium formulated ink of the present invention is preferably selenium powder.

The organic chalcogenide component used in the gallium formulated ink of the present invention, comprises: at least one organic chalcogenide having a formula selected from RZ—Z'R' and $R^2$—SH; wherein Z and Z' are independently selected from sulfur, selenium and tellurium (preferably sulfur and selenium; most preferably sulfur); wherein R is selected from H, a $C_{1-20}$ alkyl group, a $C_{6-20}$ aryl group, a $C_{1-20}$ hydroxyalkyl group, a $C_{1-20}$ mercaptoalkyl group, and an ether group (preferably R is selected from a $C_{1-20}$ alkyl group, a $C_{6-20}$ aryl group, a $C_{1-20}$ hydroxyalkyl group, and a $C_{3-20}$ ether group; more preferably R is selected from a $C_{1-20}$ alkyl group, a $C_{1-20}$ hydroxyalkyl group, and a $C_{6-20}$ aryl group; still more preferably R is selected from a $C_{1-10}$ alkyl group and a $C_{1-10}$ hydroxyalkyl group; most preferably R is selected from a $C_{1-5}$ alkyl group and a $C_{1-5}$ hydroxyalkyl group); wherein R' is selected from a $C_{1-20}$ alkyl group, a $C_{6-20}$ aryl group, a $C_{1-20}$ hydroxyalkyl group, a $C_{1-20}$ mercaptoalkyl group, and an ether group (preferably R' is selected from a $C_{1-20}$ alkyl group, a $C_{6-20}$ aryl group, a $C_{1-20}$ hydroxyalkyl group, and a $C_{3-20}$ ether group; more preferably R' is selected from a $C_{1-20}$ alkyl group, a $C_{1-20}$ hydroxyalkyl group, and a $C_{6-20}$ aryl group; still more preferably R' is selected from a $C_{1-10}$ alkyl group and a $C_{1-10}$ hydroxyalkyl group; most preferably R' is selected from a $C_{1-5}$ alkyl group and a $C_{1-5}$ hydroxyalkyl group); and wherein $R^2$ is selected from a $C_{1-20}$ alkyl group, a $C_{6-20}$ aryl group, a $C_{1-20}$ hydroxyalkyl group, a $C_{1-20}$ mercaptoalkyl group, and an ether group (preferably $R^2$ is selected from a $C_{1-20}$ alkyl group, a $C_{6-20}$ aryl group, a $C_{1-20}$ hydroxyalkyl group, and a $C_{3-20}$ ether group; more preferably $R^2$ is selected from a $C_{1-20}$ alkyl group, $C_{1-20}$ hydroxyalkyl group and a $C_{6-20}$ aryl group; still more preferably $R^2$ is selected from a $C_{1-10}$ alkyl group and a $C_{1-10}$ hydroxyalkyl group; most preferably $R^2$ is selected from a $C_{1-5}$ alkyl group and a $C_{1-5}$ hydroxyalkyl group). Optionally, R, R' and $R^2$ are selected to enhance the solubility of the organic chalcogenide in the liquid carrier component.

Optionally, Z and Z' are both sulfur. Preferably, when both Z and Z' are sulfur, R and R' are independently selected from a phenyl group, a methyl group, an ethyl group, a hydroxyethyl group, a propyl group, a butyl group, an isopropyl group and a tert-butyl group. More preferably, when both Z and Z' are sulfur, R and R' are independently selected from a butyl group, a tert-butyl group and a hydroxyethyl group.

Optionally, Z and Z' are both selenium. Preferably, when both Z and Z' are selenium, R and R' are independently selected from a phenyl group, a methyl group, an ethyl group, a propyl group, a butyl group, an isopropyl group and a tert-butyl group. More preferably, when both Z and Z' are selenium, R and R' are both a phenyl group.

The Group 1b component used in the gallium formulated ink of the present invention preferably contains copper. Most preferably, the Group 1b component is selected from $CuCl_2$ and $Cu_2O$.

The Group 1b component used in the gallium formulated ink of the present invention preferably associates with a Group 1b ligand component. Preferably, the Group 1b ligand component is selected from an organic chalcogenide having a formula $R^2$—SH (as described above) and a bidentate thiol compound. The bidentate thiol compound is preferably selected from dithiols, hydroxy thiols and nitrogen containing thiols (preferably dithiols, hydroxy thiols and nitrogen containing thiols, wherein the active chelating groups on the bidentate thiol ligand are separated by a chain of ≤four carbons (i.e., —C—C—C—C—); more preferably dithiols, hydroxy thiols and nitrogen containing thiols, wherein the active chelating groups on the bidentate thiol ligand are separated by a chain of two carbons (i.e., —C—C—)). Most preferably, the bidentate thiol compound is selected from 1,2-dimercaptoethane; 1,3-dimercaptopropane; beta-mercaptoethanol and dimercaptol.

The optional indium component used in the gallium formulated ink of the present invention, comprises indium.

The liquid carrier component used in the gallium formulated ink of the present invention can be any solvent or miscible mixtures of solvents in which the product formed by the combination of the gallium component, the selenium component, the organic chalcogenide component, the Group 1b component, the Group 1b ligand component and the optional indium component is stably dispersible. Preferably, the liquid carrier component used is selected from amines, ethers, polyethers, amide solvents (e.g., dimethylformamide, dimethylacetamide), N-methylpyrrolidone, keto-solvents (e.g., methylisobutylketone), aryl solvents (e.g., toluene), cresols, xylene and miscible mixtures thereof. Optionally, the liquid carrier component used is selected from ethers, polyethers, amide solvents (e.g., dimethylformamide, dimethylacetamide), N-methylpyrrolidone, keto-solvents (e.g., methylisobutylketone), aryl solvents (e.g., toluene), cresols, xylene and miscible mixtures thereof. Optionally, the liquid carrier component is selected from a nitrogen containing solvent and a miscible mixture of nitrogen containing solvents. Preferably, the liquid carrier component used comprises a liquid amine having a formula $NR_3$, wherein each R is independently selected from a H, a $C_{1-10}$ alkyl group, a $C_{6-10}$ aryl group, a $C_{3-10}$ aminocycloalkyl group (e.g., 1,2-diamino cyclohexyl) and a $C_{1-10}$ aminoalkyl group. Preferably, the liquid carrier component used in the preparation of the selenium/Group 1b/Group 3a ink of the present invention is selected from ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1-amino-2-propanol; 1,3-diaminopropane; 1,2-diaminopropane; 1,2-diaminocyclohexane; pyridine; pyrrolidine; 1-methylimidazole; tetramethylguanidine and mixtures thereof. More preferably, the liquid carrier component used is selected from ethylene diamine; diethylenetriamine; tris(2-aminoethyl)amine; triethylenetetramine; n-hexylamine; pyrrolidine; n-butylamine; 1,3-diaminopropane; 3-amino-1-propanol; 1-amino-2-propanol and mixtures thereof. Most preferably, the liquid carrier component used is selected from 1,3-diaminopropane, 3-amino-1-propanol, ethylene diamine and 1-amino-2-propanol.

The gallium formulated ink of the present invention, optionally, further comprises sodium.

The gallium formulated ink of the present invention, optionally, further comprise a cosolvent. Cosolvents suitable for use with the present invention are miscible with the gallium carrier and the liquid carrier. Preferred cosolvents exhibit a boiling point within 30° C. of the boiling point of the gallium carrier and the liquid carrier.

The gallium formulated ink of the present invention can, optionally, further comprise at least one modifier selected from a dispersant, a wetting agent, a polymer, a binder, an anti-foaming agent, an emulsifying agent, a drying agent, a filler, an extender, a film conditioning agent, an antioxidant, a plasticizer, a preservative, a thickening agent, a flow control agent, a leveling agent, a corrosion inhibitor and a dopant (e.g., sodium to improve electrical performance of CIGS materials). Optional modifiers can be incorporated into the gallium formulated ink of the present invention to, for example, facilitate increased shelf life, to improve flow characteristics to facilitate the method of application to a substrate (e.g., printing, spraying), to modify the wetting/spreading characteristics of the gallium formulated ink onto the substrate, and to modify the decomposition temperature of the gallium formulated ink. Some optional flow control and viscosity modifiers include polyethyleneimines, polyvinylpyrrolidones and Jeffamines®.

The relative amounts of the gallium component, the selenium component, the Group 1b component and the optional indium component contained in the gallium formulated ink of the present invention can be selectively provided to suit the particular application need and the processing technology and equipment to be used to apply the gallium formulated ink to a given substrate. Preferably, the formulated gallium ink exhibits a selenium content selected from 1 to 50 wt %; 1 to 5 wt %; 4 to 15 wt % and 5 to 10 wt % (based on the weight of the gallium formulated ink). Preferably, the gallium formulated ink exhibits a Group 1b material (i.e., copper) content selected from 0.4 to 10 wt % (based on the weight of the gallium formulated ink). Preferably, the gallium formulated ink exhibits a Group 3a (i.e., gallium plus optional indium) content of 0.4 to 10 wt % (based on the weight of the gallium formulated ink). Preferably, gallium formulated ink exhibits a molar ratio of selenium to Group 1b material to Group 3a material (i.e., gallium plus optional indium) of 2:0.5:1 to 10:1.5:1.

The method of preparing a gallium formulated ink of the present invention, comprises: providing a gallium; providing a stabilizing component, wherein the stabilizing component is selected from 1,3-propanedithiol, beta-mercaptoethanol, analogs thereof and mixtures thereof; providing an additive, wherein the additive is selected from the group consisting of pyrazine; 2-methylpyrazine; 3-methylpyrazole; methyl 2-pyrazinecarboxylate; pyrazole; praxadine; pyrazine carboxamide; pyrazine carbonitrile; 2,5-dimethylpyrazine; 2,3, 5,6-tetramethylpyrazine; 2-aminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedicarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group; tetrazole; tetrazole substituted with a $C_{1-5}$ alkyl group; 1,5-diazabicyclo[4.3.0] non-5-ene; and 1,8-diazabicyclo[5.4.0]undec-7-ene; providing a gallium carrier, wherein the gallium carrier is selected from ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1-amino-2-propanol; 1,3-diaminopropane; 1,2-diaminopropane; 1,2-diaminocyclohexane; pyridine; pyrrolidine; 1-methylimidazole; tetramethylguanidine; 2-methylpyrazine and mixtures thereof; providing a selenium component; providing an organic chalcogenide component, comprising: a first organic chalcogenide and, optionally, a second organic chalcogenide; wherein the first organic chalcogenide and the second organic chalcogenide each have a formula independently selected from RZ—Z'R' and $R^2$—SH (as described hereinabove); providing a Group 1b component comprising, as an initial component, at least one of $CuCl_2$ and $Cu_2O$; providing a Group 1b ligand component (preferably, wherein the Group 1b ligand component is selected from a material having a formula $R^2$—SH and a bidentate thiol compound, as described hereinabove); optionally, providing indium; providing a liquid carrier component, comprising: a first liquid carrier, a second liquid carrier and, optionally, a third liquid carrier; combining the gallium, the stabilizing component, the additive and the gallium carrier to produce a gallium component; combining the selenium, the first organic chalcogenide and the first liquid carrier, and heating the combination with agitation to produce a combined selenium/organic chalcogenide component; combining the Group 1b component, the Group 1b ligand component and the second liquid carrier to produce a Group 1b material/ligand component; optionally, combining the indium, the second organic chalcogenide and the third liquid carrier to produce an optional indium/organic chalcogenide component; combining the gallium component, the combined selenium/organic chalcogenide component, the Group 1b material/ligand component and the optional indium/organic chalcogenide component to form the gallium formulated ink; wherein the gallium formulated ink is a stable dispersion; and, wherein the first liquid carrier, the second liquid carrier and the optional third liquid carrier are the same or are miscible together with the gallium carrier; wherein the first organic chalcogenide and the second organic chalcogenide are both independently selected from organic chalcogenide components as defined herein above (i.e., the first organic chalcogenide and the second organic chalcogenide can be the same or different); and wherein the first liquid carrier, the second liquid carrier and the optional third liquid carrier are all selected from liquid carriers as defined herein above and are all the same or are miscible together with the gallium carrier (i.e. they can be different, but must be miscible together with the gallium carrier).

Preferably, the gallium provided for use in making the gallium formulated ink of the present invention is gallium shot or gallium ingot.

Preferably, the selenium provided for use in making the gallium formulated ink of the present invention is selenium powder.

Preferably, the selenium provided for use in making the gallium formulated ink of the present invention contributes 1 to 50 wt %, 1 to 20 wt %, 1 to 5 wt %, 4 to 15 wt %, or 5 to 10 wt % of the gallium formulated ink produced.

In providing the gallium formulated ink of the present invention, the organic chalcogenide provided is selected from a thiol, an organic dichalcogenide and mixtures thereof. When a thiol is used, the thiol preferably has a formula $R^2$—SH (as described hereinabove). When an organic dichalcogenide is used, the organic dichalcogenide preferably has a formula RZ—Z'R' (as described hereinabove). The $R^2$, R and R' groups in the thiol and organic dichalcogenide used can be selected to enhance the solubility of the product formed by the combination of the gallium component, the selenium component, the organic chalcogenide component, the Group 1b component, the optional indium component, and the optional bidentate thiol ligand in the liquid carrier.

In providing the selenium for use in the preparation of the gallium formulated ink of the present invention, the selenium and the first liquid carrier are preferably combined by adding the first liquid carrier to the selenium. More preferably, the selenium and the first liquid carrier are combined using inert techniques, followed with continuous agitation and heating to reflux until the selenium is dissolved in the first liquid carrier. Preferably, the first liquid carrier is maintained at a temperature of 20 to 240° C. during the combining of the first liquid carrier and the selenium. Optionally, the first liquid carrier and selenium can be heated above the melting point of selenium (220° C.) during the combining process.

Optionally, the selenium and the first organic chalcogenide are combined to form a combined selenium/organic chalcogenide component for use in the preparation of the gallium formulated ink of the present invention. The formation of a combined selenium/organic chalcogenide component preferably, comprises: providing selenium, providing the first organic chalcogenide having a formula selected from RZ—Z'R' and $R^2$—SH (as described hereinabove), and providing the first liquid carrier; combining the selenium, the first organic chalcogenide and the first liquid carrier; heating the combination (preferably to a temperature within 25° C. of the boiling point temperature of the first liquid carrier, most preferably to heating to reflux) with agitation (preferably for a period of 0.1 to 40 hrs; more preferably for a period of 0.1 to 8 hrs) to form the combined selenium/organic chalcogenide component stably dispersed in the first liquid carrier. Preferably, the molar ratio of selenium to the first organic chalcogenide in the combined selenium/organic chalcogenide component is 2:1 to 20:1, more preferably 2:1 to 14:1, still more preferably 2:1 to 10:1, most preferably 2:1 to 8:1.

When using a first organic chalcogenide in the liquid state, providing the combined selenium/organic chalcogenide component for use in the preparation of the gallium formulated ink of the present invention, optionally, further comprises heating the combined selenium and first liquid carrier before adding the liquid first organic chalcogenide. Preferably, providing the combined selenium/organic chalcogenide component for use in preparation of the gallium formulated ink of the present invention, optionally, further comprises: heating the combined first liquid carrier and selenium powder before and during the addition of the liquid first organic chalcogenide. More preferably, the combined first liquid carrier and selenium powder are maintained at a temperature of 20 to 240° C. during the addition of the liquid first organic chalcogenide. Most preferably, any liquid first organic chalcogenide is added to the combined selenium and first liquid carrier by gradually adding the liquid first organic chalcogenide to the combined selenium and first liquid carrier with continuous agitation and heating to reflux.

Providing the Group 1b component for use in the preparation of the gallium formulated ink of the present invention, preferably comprises: providing a Group 1b containing substance selected from the group consisting of $CuCl_2$ and $Cu_2O$.

Optionally, in providing the Group 1b component for use in the preparation of the gallium formulated ink of the present invention, the Group 1b component, a Group 1b ligand component and the second liquid carrier are combined to form a combined Group 1b material/ligand component. More preferably, the Group 1b component, the Group 1b ligand component and second liquid carrier are combined using inert techniques, followed with continuous agitation and heating to reflux until the solids are dissolved in the second liquid carrier. Preferably, the second liquid carrier is maintained at a temperature of 20 to 150° C. (more preferably a temperature of 20 to 100° C.) during the combining of the Group 1b component, the Group 1b ligand component and the second liquid carrier.

Providing the Group 1b material/ligand component, preferably comprises: providing a Group 1b component selected from $CuCl_2$ and $Cu_2O$; providing a Group 1b ligand component selected from a material having a formula $R^2$—SH (as described hereinabove) and a bidentate thiol compound (as described hereinabove); and providing a second liquid carrier; combining the Group 1b component, the Group 1b ligand component and the second liquid carrier; heating the combination (preferably to a temperature of 25 to 100° C. with agitation (preferably for a period of 0.1 to 40 hrs; more preferably for a period of 0.1 to 8 hrs) to form the Group 1b material/ligand component stably dispersed in the second liquid carrier. Preferably, the molar ratio of copper to the chelating groups of the Group 1b ligand component in the Group 1b material/ligand component is 2:1 to 1:16, more preferably 2:1 to 1:8, still more preferably 1:1 to 1:6, most preferably 1:1 to 1:4. Most preferably, the Group 1b material/ligand component contains ≥1.0 wt % copper.

Providing the optional indium component for use in the preparation of the gallium formulated ink of the present invention, preferably comprises: providing indium; providing a second organic chalcogenide (as described above); and providing a third liquid carrier (as described above); combining the indium, the second organic chalcogenide and the third liquid carrier; heating the combination (preferably to a temperature within 25° C. of the boiling point temperature of the third liquid carrier, most preferably to heating to reflux) with agitation (preferably for a period of 0.1 to 40 hrs; more preferably for a period of 0.1 to 8 hrs) to form a combined indium/organic chalcogenide component stably dispersed in the third liquid carrier. Preferably, the molar ratio of indium to second organic chalcogenide used in providing the combined indium/organic chalcogenide component is 2:3 to 1:6; most preferably 2:3 for organic dichalcogenides (i.e., RZ—Z'R') and 1:3 for thiols (i.e., $R^2$—SH). Preferably, the third liquid carrier is an amine.

Preferably, in providing the gallium formulated ink of the present invention, the timing of the addition of the organic chalcogenide component and the Group 1b ligand component depends on their physical state. For solid organic chalcogenides and solid Group 1b ligand components, the solid organic chalcogenides and solid Group 1b ligand components are preferably combined with other solids (e.g., solid selenium powder, solid Group 1b component) before combination with the liquid carrier component. For liquid organic chalcogenides and liquid Group 1b ligand components, the liquid organic chalcogenide and liquid Group 1b ligand components are preferably added to the liquid carrier component following the addition of at least one of the selenium powder and the Group 1b component.

Providing the liquid carrier component for use in the preparation of the gallium formulated ink of the present invention, preferably comprises: providing a liquid carrier (as described hereinabove) in which the product formed by the combination of the gallium component, the selenium component, the organic chalcogenide component, the Group 1b component, the Group 1b ligand component and the optional indium component is stable. The liquid carrier component can be provided in separate portions, for example, as a first liquid carrier, a second liquid carrier and a third liquid carrier. The separate portions can vary in volume and composition. The composition of each portion can be the same or can be different, provided that the portions are collectively miscible together with the gallium carrier.

Optionally, the method of preparing the gallium formulated ink of the present invention, further comprises: providing a sodium source; and combining the sodium source with the gallium component, the combined selenium/organic chalcogenide component, the Group 1b material/ligand component and the optional indium component.

Optionally, the method of preparing the gallium formulated ink of the present invention, further comprises: providing a cosolvent; and, combining the cosolvent with the gallium component, the selenium component, the organic chalcogenide component, the Group 1b containing substance, the Group 1b ligand component, the optional indium component and the liquid carrier component. Suitable cosolvents are miscible with the liquid carrier component contained in the gallium formulated ink and do not have the effect of destabilizing the gallium formulated ink. Preferred cosolvents further exhibit a boiling point within 30° C. of the boiling point of the liquid carrier component contained in the gallium formulated ink.

Optionally, the method of preparing the gallium formulated ink of the present invention, further comprises: providing an optional modifier; and, combining the optional modifier with the liquid carrier component; wherein the optional modifier is selected from a dispersant, a wetting agent, a polymer, a binder, an anti-foaming agent, an emulsifying agent, a drying agent, a filler, an extender, a film conditioning agent, an antioxidant, a plasticizer, a preservative, a thickening agent, a flow control agent, a leveling agent, a corrosion inhibitor and a dopant.

The gallium formulated ink of the present invention can be used in the preparation of a variety of semiconductor materials comprising selenium (e.g., thin layer transistors, solar cells, electrophotography components, rectifiers, photographic exposure meters, photocopying media) and in the preparation of chalcogenide containing phase change memory devices.

Preferably, the method for depositing a gallium formulated ink on a substrate, comprises: providing a substrate; providing a gallium formulated ink of the present invention; depositing the gallium formulated ink on the substrate; heating the deposited gallium formulated ink to eliminate the gallium carrier, the first liquid carrier, the second liquid carrier and the third liquid carrier leaving a Group 1b/gallium/(optional indium)/Group 6a material on the substrate; and, optionally, annealing the Group 1b/gallium/(optional indium)/Group 6a material; wherein the Group 1b/gallium/(optional indium)/Group 6a material is according to the formula $Na_L Cu_m Ga_d In_{(1-d)} S_{(2+e)(1-f)} Se_{(2+e)f}$, wherein 0≤L≤0.25, 0.25≤m≤1.5, 0≤d≤1, −0.2≤e≤0.5, 0≤f≤1 wherein 0.5≤(L+m)≤1.5 and 1.8≤{(2+e)f+(2+e)(1−f)}≤2.5.

The gallium formulated ink of the present invention can be deposited onto a substrate using conventional processing techniques such as wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray pyrolysis and spray deposition. Preferably, the gallium formulated ink of the present invention is deposited onto a substrate using conventional spray deposition techniques. Preferably, the gallium formulated ink of the present invention is deposited onto a substrate under an inert atmosphere (e.g., under nitrogen).

Preferably, when treating the deposited Group 1b/gallium/(optional indium)/Group 6a material to remove the gallium carrier and the liquid carrier, the deposited Group 1b/gallium/(optional indium)/Group 6a material is heated to a temperature above the boiling point temperatures of the gallium carrier and the liquid carrier. Optionally, the deposited Group 1b/gallium/(optional indium)/Group 6a material is heated to a temperature of 5 to 500° C. Optionally, the deposited Group 1b/gallium/(optional indium)/Group 6a material is heated to a temperature of 5 to 450° C. under vacuum.

The substrate used can be selected from conventional materials used in conjunction with the preparation of a semiconductor comprising selenium or in conjunction with chalcogenide containing phase change memory devices. For use in some applications, the substrate preferably comprises a layer of material selected from molybdenum, aluminum and copper. For use in the preparation of CIGS materials for use in photovoltaic devices, the substrate preferably comprises a layer of molybdenum. In some applications, the molybdenum, aluminum or copper substrate layer can be a coating on a carrier substance, such as, glass, foil, and plastic (e.g., polyethylene terephthalate and polyimides). Optionally, the substrate is sufficiently flexible to facilitate roll-to-roll production of CIGS materials for use in photovoltaic devices.

Optionally, the method for depositing Group 1b/gallium/(optional indium)/Group 6a material on a substrate further comprises annealing the deposited Group 1b/gallium/(optional indium)/Group 6a. Annealing temperatures for the deposited Group 1b/gallium/(optional indium)/Group 6a material can range from 200 to 650° C. with annealing times of 30 seconds to 5 hours. Optionally, additional Group 6a material can be introduced during the annealing process in the form of at least one of a selenium ink, a selenium vapor, a selenium powder, a hydrogen selenide gas, a sulfur powder and a hydrogen sulfide gas. Optionally, the annealing process is a two stage anneal. In the first annealing stage the deposited material is heated to a temperature of 200 to 500° C. with a first stage annealing time of 30 seconds to 1 hour. In the second annealing stage the deposited material is heated to a temperature of 200 to 650° C. with a second stage annealing time of 30 seconds to 1 hour.

Optionally, the method for depositing a Group 1b/gallium/(optional indium)/Group 6a material on a substrate further comprises: providing a sodium source; and depositing sodium on the substrate.

Using the method of depositing Group 1b/gallium/(optional indium)/Group 6a material of the present invention, it is possible to provide uniform or graded semiconductor films comprising a Group 1b/gallium/(optional indium)/Group 6a material (e.g., a CIGS material). For example, a graded CIGS material can be prepared by depositing varying formulations of the gallium formulated ink of the present invention with different relative concentrations of the gallium, selenium, Group 1b and optional indium components (i.e., by depositing multiple layers of the precursor materials in different compositions). In the preparation of CIGS materials it is sometimes desirable to provide graded films (e.g., with respect to Ga concentration). It is conventional to provide a graded $Ga/(Ga^+ In)$ ratio as a function of depth in a CIGS material for use in photovoltaic devices to facilitate improved separation of the photogenerated charge carriers and to facilitate reduced recombination at the back contact. Accordingly, it is believed to be desirable to tailor the CIGS material composition to achieve the desired grain structure and the highest efficiency photovoltaic device characteristics.

Some embodiments of the present invention will now be described in detail in the following Examples.

Examples 1-21

Preparation of Gallium Ink

Gallium inks were prepared using the materials and amounts thereof indicated in TABLE 1. Specifically, for each example noted in TABLE 1 gallium (shot from Alfa Aesar) was weighed out into a reactor, outfitted with a stir bar. The liquid carrier was then added to the reactor followed by any additional solid materials listed in TABLE 1 (i.e., pyrazine). The reactor was then assembled in the glove box sealing the reactor under nitrogen. The reactor was then transferred to a fume hood where the reactor was maintained under positive nitrogen pressure with a nitrogen manifold. The remaining liquid materials were then added via septa on the reactor using an inert syringe. The contents of the reactor were then treated under the reaction conditions noted in Table 1. Upon cooling, the reactor was transferred into the glove box for unloading. The product inks were then decanted from the reactor to remove any residual solids. The decanted product inks were observed to remain clear and stable following storage for one week at room temperature under nitrogen (i.e., no suspended solids were evident).

TABLE 1

| Ex. | Ga (in g) | Stabilizing Component (SC) | SC (in g) | Additive (A) | A (in g) | Liquid Carrier (LC) | LC (in g) | Cond |
|---|---|---|---|---|---|---|---|---|
| 1 | 0.066 | 1,3-propane dithiol | 0.204 | 1,5-diazobicyclo[4.3.0]non-5-ene | 0.234 | 2-methyl pyrazine | 2.8 | A |
| 2 | 0.066 | beta-mercaptoethanol | 0.258 | 1,5-diazobicyclo[4.3.0]non-5-ene | 0.234 | 2-methyl pyrazine | 2.74 | A |
| 3 | 0.066 | 1,3-propane dithiol | 0.204 | 1,5-diazobicyclo[4.3.0]non-5-ene | 0.234 | 1,3-diamino propane | 2.8 | A |
| 4 | 0.149 | 1,3-propane dithiol | 0.463 | 1,5-diazobicyclo[4.3.0]non-5-ene | 0.798 | 1,3-diamino propane | 6.09 | B |
| 5 | 0.146 | 1,3-propane dithiol | 0.455 | 1,5-diazobicyclo[4.3.0]non-5-ene | 1.04 | 1,3-diamino propane | 5.7 | B |
| 6 | 0.192 | 1,3-propane dithiol | 0.597 | 1,5-diazobicyclo[4.3.0]non-5-ene | 1.03 | 1,3-diamino propane | 2.99 | B |
| 7 | 0.272 | 1,3-propane dithiol | 0.846 | 1,5-diazobicyclo[4.3.0]non-5-ene | 1.94 | 1,3-diamino propane | 3.74 | B |
| 8 | 0.212 | beta-mercaptoethanol | 0.832 | 1,5-diazobicyclo[4.3.0]non-5-ene | 1.13 | 1,3-diamino propane | 3.13 | B |
| 9 | 0.361 | beta-mercaptoethanol | 1.41 | 1,5-diazobicyclo[4.3.0]non-5-ene | 2.57 | 1,3-diamino propane | 4.67 | B |
| 10 | 0.358 | 1,3-propane dithiol | 1.11 | 1,5-diazobicyclo[4.3.0]non-5-ene | 1.91 | 1,3-diamino propane | 8.52 | C |
| 11 | 0.435 | 1,3-propane dithiol | 1.352 | 1,5-diazobicyclo[4.3.0]non-5-ene | 3.11 | 1,3-diamino propane | 9.66 | C |
| 12 | 0.266 | beta-mercaptoethanol | 1.043 | 1,5-diazobicyclo[4.3.0]non-5-ene | 1.42 | 1,3-diamino propane | 10.52 | C |
| 13 | 0.23 | beta-mercaptoethanol | 0.903 | 1,5-diazobicyclo[4.3.0]non-5-ene | 1.64 | 1,3-diamino propane | 8.78 | C |
| 14 | 0.2 | 1,3-propane dithiol | 0.619 | 2-methyl pyrazine | 0.862 | 1,3-diamino propane | 8.32 | D |
| 15 | 0.2 | beta-mercaptoethanol | 0.674 | 2-methyl pyrazine | 0.862 | 1,3-diamino propane | 8.26 | D |
| 16 | 0.194 | 1,3-propane dithiol | 0.601 | 2-methyl pyrazine | 0.914 | 1,3-diamino propane | 8 | E |
| 17 | 0.21 | beta-mercaptoethanol | 0.706 | 2-methyl pyrazine | 0.992 | 1,3-diamino propane | 8.57 | E |
| 18 | 0.115 | 1,3-propane dithiol | 0.357 | 1,8-diazabicyclo[5.4.0]udec-7-ene | 0.803 | 1,3-diamino propane | 10.32 | F |
| 19 | 0.106 | 1,3-propane dithiol | 0.330 | pyrrolidino-1-cyclohexene | 0.738 | 1,3-diamino propane | 9.51 | F |

TABLE 1-continued

| Ex. | Ga (in g) | Stabilizing Component (SC) | SC (in g) | Additive (A) | A (in g) | Liquid Carrier (LC) | LC (in g) | Cond |
|---|---|---|---|---|---|---|---|---|
| 20 | 0.110 | 1,3-propane dithiol | 0.342 | 1-methyl imidazole | 0.415 | 1,3-diamino propane | 10.25 | F |
| 21 | 0.127 | 1,3-propane dithiol | 0.396 | pyrazine | 0.468 | 1,3-diamino propane | 11.72 | F |

A reactor was placed on an aluminum heating block, the heating block temperature was then set and maintained at 60° C. for 1 hr; the heating block temperature was then set and maintained at 100° C. for 1 hr; the heating block temperature was then set and maintained at 140° C. overnight; the reactor was then removed from the heating source and allowed to cool.
B reactor was placed on an aluminum heating block, the heating block temperature was then set and maintained at 120° C. for 24 hrs; the heating block temperature was then set and maintained at 140° C. for 4 hrs; the reactor was then removed from the heating source and allowed to cool.
C reactor was placed on an aluminum heating block, the heating block temperature was then set and maintained at 140° C. for 24 hrs; the heating block temperature was then set and maintained at 150° C. for 4 hrs; the heating block temperature was then set and maintained at 160° C. for 2 hrs; the reactor was then removed from the heating source and allowed to cool.
D reactor was placed on an aluminum heating block, the heating block temperature was then set and maintained at 160° C. for 7 hrs; the reactor was then removed from the heating source and allowed to cool.
E reactor was placed on an aluminum heating block, the heating block temperature was then set and maintained at 140° C. for 6 hrs; the reactor was then removed from the heating source and allowed to cool.
F reactor was placed on an aluminum heating block, the heating block temperature was then set and maintained at 140° C. for 30 hrs; the reactor was then removed from the heating source and allowed to cool.

Example 22-25

Gallium Ink Analysis

Decanted product Gallium inks from Examples 10, 12 and 14-15 were placed into a separate round bottom flask under nitrogen. Volatiles were then removed from the product samples under reduced pressure. For Example 22, the volatiles were removed by initially rotovaping at 2.67 kPa and 80-85° C. For Examples 23-25, the volatiles were removed by initially performing short-path distillation at 0.13 kPa and 80-85° C. All samples were then left under house vacuum at 2.67 kPa for two days to remove any residual volatiles. The sample material left in the round bottom flasks was then analyzed by inductively coupled plasma optical emission spectrometry (ICP-OES). The results of those analyzes are provided in TABLE 2.

TABLE 2

|  | Example # | | | |
|---|---|---|---|---|
|  | 22 | 23 | 24 | 25 |
| Gallium Ink From Example # | 10 | 12 | 14 | 15 |
| Initial Ink Mass (in g) | 3 | 4 | 3 | 3 |
| Theoretical Ga Concentration in Initial Ink (wt %) | 3 | 2 | 2 | 2 |
| Theoretical Mass Ga in Ink (in g) | 0.09 | 0.08 | 0.06 | 0.06 |
| Ink Mass After Stripping (in g) | 0.456 | 0.392 | 0.396 | 0.506 |
| Measured Mass Ga in Ink (in g) | 0.053 | 0.020 | 0.050 | 0.042 |
| Measured Mass S in Ink (in g) | 0.097 | 0.077 | 0.098 | 0.086 |
| Measured Mass C in Ink (in g) | 0.19 | 0.18 | 0.16 | 0.20 |
| Measured Mass H in Ink (in g) | 0.031 | 0.031 | 0.030 | 0.039 |
| Measured Mass N in ink (in g) | 0.052 | 0.049 | 0.053 | 0.070 |

Example 26

Preparation Indium Component

Indium metal (2 g, shot, 99.99%, from Alfa Aesar), 33.16 g of ethylene diamine (Acros 99+%) and 4.84 grams of 2-hydroxyethyldisulfide (Alfa Aesar, 90%) were combined in a 100 mL 1-neck flask outfitted with a condenser. The flask contents were then purged with nitrogen and refluxed at 120° C. for twenty-one (21) hours, at which point a large portion of the indium was consumed forming a brownish-orange solution. The brownish-orange solution product indium component was transferred via cannula to a vial. The product indium component was estimated to have a 3.75 wt % concentration of indium metal based on the weight of indium remaining in the flask following cannulation.

Example 27

Preparation Selenium Component

Selenium powder, 200 mesh (4.0 g)(from Strem Chemicals, Inc.) was weighed into a mL vial. The vial was then transferred into a nitrogen glove box. 1,3-diaminopropane (Acros 99+%) (14.49 g) was then added to the vial in the glove box. The vial was placed into a reactor and sealed under nitrogen. The vial/reactor was transferred to a fume hood where it was hooked to a nitrogen manifold and di-n-butyldisulfide (1.51 g) (Acros, 98%) was added to the vial via syringe. The contents of the vial were heated to reflux with stirring for six (6) hours producing a black solution product combined selenium component. The solution (20% w/w Se) was stored under nitrogen until use.

Example 28

Preparation Copper Component

To an 8 mL parallel reactor tube, 118 mg of copper (II) chloride (anhydrous, Strem, 98%), 190 mg of 1,3-propanedithiol (Acros, 98%), and 2.49 g of 1,3-diaminopropane (Acros, 99%) were weighed out in air. The reactor was then sealed and inerted with nitrogen. The reactor tube was then heated to 80 C and held there for 2 hrs, with magnetic stirring. The reaction was then cooled to room temperature, and the product solution was stored under nitrogen. The 2% (w/w) copper solution had a slight yellow tint, with no visible solids.

Examples 29-43

Preparation of Formulated Group 1b/Group 3a/Selenium Inks

Formulated group 1b/group 3a/selenium inks were prepared using the components in the amounts noted in TABLE 3. The components were added to a sample vial starting with the indium component, then adding the gallium ink, then adding the selenium component, then adding the copper component and then mixing vigorously for 10 seconds. The product

TABLE 3

| Ex. | In Comp | In Comp (in mg) | Ga Ink | Ga Ink (in mg) | Se Comp | Se Comp (in mg) | Cu Comp | Cu Comp (in mg) |
|---|---|---|---|---|---|---|---|---|
| 29 | Ex. 26 | 108 | Ex. 4 | 41 | Ex. 27 | 46 | Ex. 28 | 137 |
| 30 | Ex. 26 | 108 | Ex. 5 | 41 | Ex. 27 | 46 | Ex. 28 | 137 |

TABLE 3-continued

| Ex. | In Comp | In Comp (in mg) | Ga Ink | Ga Ink (in mg) | Se Comp | Se Comp (in mg) | Cu Comp | Cu Comp (in mg) |
|---|---|---|---|---|---|---|---|---|
| 31 | — | — | Ex. 4 | 157 | Ex. 27 | 44 | Ex. 28 | 132 |
| 32 | Ex. 26 | 138 | Ex. 6 | 26 | Ex. 27 | 59 | Ex. 28 | 176 |
| 33 | Ex. 26 | 138 | Ex. 7 | 26 | Ex. 27 | 59 | Ex. 28 | 176 |
| 34 | Ex. 26 | 1417 | Ex. 6 | 269 | Ex. 27 | 609 | Ex. 28 | 1705 |
| 35 | Ex. 26 | 398 | Ex. 14 | 151 | Ex. 27 | 171 | Ex. 28 | 479 |
| 36 | Ex. 26 | 398 | Ex. 15 | 151 | Ex. 27 | 171 | Ex. 28 | 479 |
| 37 | Ex. 26 | 263 | — | — | Ex. 27 | 85 | Ex. 28 | 252 |
| 38 | Ex. 26 | 206 | Ex. 14 | 65 | Ex. 27 | 83 | Ex. 28 | 246 |
| 39 | Ex. 26 | 178 | Ex. 14 | 97 | Ex. 27 | 82 | Ex. 28 | 243 |
| 40 | Ex. 26 | 151 | Ex. 14 | 127 | Ex. 27 | 81 | Ex. 28 | 240 |
| 41 | Ex. 26 | 208 | Ex. 15 | 59 | Ex. 27 | 84 | Ex. 28 | 249 |
| 42 | Ex. 26 | 181 | Ex. 15 | 88 | Ex. 27 | 83 | Ex. 28 | 247 |
| 43 | Ex. 26 | 154 | Ex. 15 | 117 | Ex. 27 | 83 | Ex. 28 | 246 |

Examples 44-48

Formulated Group 1b/Group 3a/Selenium Ink Stability

The stability of the product formulated group 1b/Group 3a/selenium inks is noted in TABLE 4. Specifically, the noted inks were stored at room temperature in a nitrogen purged box in capped vials and visual observations of the inks were made using a 50× pencil scope initially and after 29 days of storage. The results of those observations are reported in TABLE 4.

TABLE 4

| Ex. | Formulated Ink | Initial Observation | Final Observation |
|---|---|---|---|
| 44 | 29 | no visible particulates | very few tiny particulates |
| 45 | 30 | no visible particulates | very few tiny particulates |
| 46 | 31 | no visible particulates | debris on glass; filament-like particles |
| 47 | 32 | no visible particulates | very few tiny particulates |
| 48 | 33 | no visible particulates | very few tiny particulates |

Examples 49-53

Preparation of Group 1b/Group 3a/Selenium Films

Thin films of group 1b/group 3a/selenium material were prepared by placing 12 drops of the formulated ink noted in TABLE 5 onto molybdenum coated glass slides sitting on a hot plate at 80° C. in a nitrogen glove box. The hot plate temperature was then ramped to 400° C. over a ramp time of about 15 minutes. The hot plate temperature was held at 400° C. for 30 minutes, before being switched off. The glass slides were then allowed to cool to room temperature on the surface of the hotplate. The deposited films were then analyzed by x-ray diffraction ("XRD") using a Rigaku D/MAX 2500 at 50 kV/200 mA of nickel filtered copper Kα radiation. The films were scanned from 5 to 85 degrees of 2θ in steps of 0.03 degrees at 0.25 degrees/min. Reflection geometry was used and the samples were rotated at 20 RPM. The resulting XRD spectra correlated well with known XRD spectra for CIGS compounds (e.g., 00-040-1488 from the JCPDS Power Diffraction File for a $CuIn_{0.5}Ga_{0.5}Se_2$ CIGS phase).

TABLE 5

| Example | Formulated Ink |
|---|---|
| 49 | Prod. of Ex. 29 |
| 50 | Prod. of Ex. 30 |
| 51 | Prod. of Ex. 31 |
| 52 | Prod. of Ex. 32 |
| 53 | Prod. of Ex. 33 |

Example 54

Preparation of Group 1b/Group 3a/Selenium Film

A thin film of group 1b/group 3a/selenium material was prepared by spin-coating the formulated ink product from Example 34 onto a two inch square molybdenum coated glass slide. In each example, the slide was first cleaned with a 5% ammonium hydroxide solution, then rinsed with deionized water and alcohol. A first coat of the formulated ink was applied to the slide by dispensing 1,000 mg of the formulated ink onto the slide. The slide was then spun up to 200 rpm with a 10 second ramp time, and held at 200 rpm for 60 seconds. The slide was then spun up to 2000 rpm with a 10 second ramp time, and held at 2000 rpm for 30 seconds. The slide was then placed on a first hot plate at 130° C. for 4 minutes. The slide was then placed on a hot plate at 240° C. for 4 minutes. The glass slide was then placed on a hot plate at 400° C. for 4 minutes. The slide was then placed back on the hot plate at 130° C. for 4 minutes. The slide was then removed from the hot plate and allowed to cool to room temperature for 4 minutes. A second coat of the formulated ink was then applied to the slide by dispensing another 1,000 mg of the formulated ink onto the slide. The slide was then spun up to 1200 rpm with a 10 second ramp time, and held at 1200 rpm for 60 seconds. The slide was then spun up to 2000 rpm with a 10 second ramp time, and held at 2000 for 30 seconds. The slide was then placed on a first hot plate at 130° C. for 4 minutes. The slide was then placed on a hot plate at 240° C. for 4 minutes. The glass slide was then placed on a hot plate at 400° C. for 4 minutes. The slide was then placed back on the hot plate at 130° C. for 4 minutes. The slide was then removed from the hot plate and allowed to cool to room temperature for 4 minutes. A third coat of the formulated ink was then applied to the slide by dispensing another 1,000 mg of the formulated ink onto the slide and performing the spin cycles as noted for the second coat. The slide was then placed on a hot plate at 130° C. for 4 minutes. The slide was then placed on a hot plate at 240° C. for 4 minutes. The slide was then placed on a hot plate at 400° C. for 30 minutes. The slide was then removed from the hot plate and allowed to cool to room temperature.

The glass slides with the deposited film were mounted on conductive carbon tape and analyzed by energy dispersive x-ray spectroscopy ("EDS") in a Hitachi 3400 VP-SEM in variable pressure mode with a 30 mm² SD Detector at 15 KeV. The results of the analyses are provided in TABLE 6.

The deposited films were then annealed by heating at 550° C. for 90 minutes in a selenium atmosphere. The glass slides with the deposited film post annealing were analyzed again by EDS. The results of the analyses are provided in TABLE 6.

TABLE 6

|  | Moles Cu | Moles In | Moles Ga | Moles Se |
|---|---|---|---|---|
| Pre-annealing | 0.59 | 0.66 | .034 | 1.26 |
| Post-annealing | 0.60 | 0.63 | 0.37 | 1.77 |

Example 55-56

Preparation of Group 1b/Group 3a/Selenium Film

Thin films of group 1b/group 3a/selenium material in Examples 55-56 were prepared by spin-coating the formulated ink product from Examples 35 and 36, respectively, onto one inch square molybdenum coated glass slides. The glass slides were first cleaned with a 5% ammonium hydroxide solution, then rinsed with deionized water and alcohol. In each example, a first coat of the formulated ink was applied to the slide by dispensing 300 mg of the formulated ink onto the slide. The slide was then spun up to 200 rpm with a 10 second ramp time, and held at 200 rpm for 60 seconds. The slide was then spun up to 1200 rpm with a 10 second ramp time, and held at 1200 rpm for 30 seconds. The glass slide was then placed on a first hot plate at 130° C. for 3 minutes. The glass slide was then placed on a second hot plate at 240° C. for 3 minutes. The glass slide was then placed on a third hot plate set at 400° C. for 3 minutes. The glass slide was then placed back on the first hot plate set at 130° C. for 3 minutes. The glass slide was then removed from the first hot plate and allowed to cool at room temperature for 3 minutes. A second coat of the formulated ink was then applied to the slide by dispensing another 300 mg of the formulated ink onto the slide. The slide was then spun up to 200 rpm with a 10 second ramp time, and held at 200 rpm for 60 seconds. The slide was then spun up to 1200 rpm with a 10 second ramp time, and held at 1200 for 30 seconds. The glass slide was then placed on a first hot plate at 130° C. for 3 minutes. The glass slide was then placed on a second hot plate at 240° C. for 3 minutes. The glass slide was then placed on a third hot plate set at 400° C. for 3 minutes. The glass slide was then placed back on the first hot plate set at 130° C. for 3 minutes. The glass slide was then removed from the first hot plate and allowed to cool at room temperature for 3 minutes. A third coat of the formulated ink was then applied to the slide by dispensing another 300 mg of the formulated ink onto the slide and performing the spin cycles as noted for the second coat. The slide was then placed on a hot plate at 130° C. for 3 minutes. The slide was then placed on a hot plate at 240° C. for 3 minutes. The slide was then placed on a hot plate at 400° C. for 30 minutes. The slide was then removed from the hot plate and allowed to cool to room temperature.

The deposited films were then annealed by heating at 630° C. for 60 minutes in a selenium atmosphere. The glass slides with the deposited films were then mounted on conductive carbon tape and analyzed by energy dispersive x-ray spectroscopy ("EDS") in a Hitachi 3400 VP-SEM in variable pressure mode with a 30 mm² SD Detector at 15 KeV. The results of the analyses are provided in TABLE 7.

TABLE 7

| Ex. | Moles Cu | Moles In | Moles Ga | Moles Se |
|---|---|---|---|---|
| 55 | 0.59 | 0.66 | 0.34 | 1.47 |
| 56 | 0.49 | 0.69 | 0.31 | 1.57 |

Examples 57-63

Preparation of Group 1b/Group 3a/Selenium Film

Thin films of group 1b/group 3a/selenium material in Examples 57-63 were prepared by drop casting the formulated ink product from Examples 37-43, respectively. Specifically, in each of Examples 57-63, eight drops of the formulated ink was placed onto a molybdenum coated glass slide resting on the surface of a hot plate. The hot plate set point temperature was then raised to 80° C. and held there until all the liquid evaporated from the deposited ink. The hot plate set point temperature was then ramped to 400° C. over a ramp time of about 15 minutes. The hot plate set point temperature was then held at 400° C. for 30 minutes, before being switched off. The glass slides were then allowed to cool to room temperature on the surface of the hot plate. The product films were then analyzed by energy dispersive x-ray spectroscopy ("EDS") in a Hitachi 3400 VP-SEM in variable pressure mode with a 30 mm² SD Detector at 15 KeV. The results of the analysis are provided in TABLE 8.

TABLE 8

| Ex. | Moles Cu | Moles In | Moles Ga | Moles Se |
|---|---|---|---|---|
| 57 | 0.48 | 1.00 | 0 | 1.41 |
| 58 | 0.48 | 0.79 | 0.21 | 1.31 |
| 59 | 0.50 | 0.72 | 0.28 | 1.29 |
| 60 | 0.52 | 0.59 | 0.41 | 1.26 |
| 61 | 0.44 | 0.75 | 0.25 | 1.32 |
| 62 | 0.46 | 0.67 | 0.33 | 1.25 |
| 63 | 0.53 | 0.60 | 0.40 | 1.25 |

We claim:

1. A method for depositing a Group 1b/gallium/(optional indium)/Group 6a material on a substrate, comprising:
   providing a substrate;
   providing a gallium formulated ink, comprising, as initial components:
   (a) a Group 1b/gallium/(optional indium)/Group 6a system which comprises a combination of, as initial components:
      a gallium component, comprising, as initial components: gallium, a stabilizing component, an additive and a gallium carrier;
      a selenium component;
      an organic chalcogenide component: comprising at least one organic chalcogenide having a formula selected from the group consisting of RZ—Z'R' and R²—SH; wherein Z and Z' are independently selected from the group consisting of sulfur, selenium and tellurium; wherein R is selected from the group consisting of H, $C_{1-20}$ alkyl group, a $C_{6-20}$ aryl group, a $C_{1-20}$ hydroxyalkyl group, a $C_{1-20}$ mercaptoalkyl group and an ether group; wherein R' and R² are selected from a $C_{1-20}$ alkyl group, a $C_{6-20}$ aryl group, a $C_{1-20}$ hydroxyalkyl group, a $C_{1-20}$ mercaptoalkyl group and an ether group;

a Group 1b component comprising, as an initial component, at least one of $CuCl_2$ and $Cu_2O$;

optionally, a bidentate thiol component;

optionally, an indium component; and, (b) a liquid carrier component;

wherein the stabilizing component is selected from the group consisting of 1,3-propanedithiol, beta-mercaptoethanol, analogs thereof and mixtures thereof;

wherein the additive is selected from the group consisting of pyrazine; 2-methylpyrazine; 3-methylpyrazole; methyl 2-pyrazinecarboxylate; pyrazole; praxadine; pyrazine carboxamide; pyrazine carbonitrile; 2,5-dimethylpyrazine; 2,3,5,6-tetramethylpyrazine; 2-aminopyrazine; 2-ethylpyrazine; quinoxaline; quinoxaline substituted with a $C_{1-5}$ alkyl group; 2-pyrazine carboxylic acid; 2-methylquinoxaline; 2,3-pyrazinedicarboxamide; 2,3-pyrazinedicarbonitrile; pyrrolidino-1-cyclohexene; pyrrolidino-1-cyclopentene; phenazine; phenazine substituted with a $C_{1-5}$ alkyl group; isoquinoline; isoquinoline substituted with a $C_{1-5}$ alkyl group; indoles; indoles substituted with a $C_{1-5}$ alkyl group; imidazole; imidazole substituted with a $C_{1-5}$ alkyl group; tetrazole; tetrazole substituted with a $C_{1-5}$ alkyl group; 1,5-diazabicyclo[4.3.0]non-5-ene; and 1,8-diazabicyclo[5.4.0]undec-7-ene;

wherein the gallium carrier is selected from the group consisting of ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1-amino-2-propanol; 1,3-diaminopropane; 1,2-diaminopropane; 1,2-diaminocyclohexane; pyridine; pyrrolidine; 1-methylimidazole; tetramethylguanidine; 2-methylpyrazine and mixtures thereof; and, wherein the Group 1b/gallium/(optional indium)/Group 6a system is stable in the liquid carrier component;

depositing the gallium formulated ink on the substrate;

heating the deposited gallium formulated ink to eliminate the gallium carrier, the first liquid carrier, the second liquid carrier and the, optional, third liquid carrier leaving a Group 1b/gallium/(optional indium)/Group 6a material on the substrate; and, optionally, annealing the Group 1b/gallium/(optional indium)/Group 6a material;

wherein the Group 1b/gallium/(optional indium)/Group 6a material is according to the formula $Na_L Cu_m Ga_d In_{(1-d)} S_{(2+e)(1-f)} Se_{(2+e)f}$, wherein $0 \leq L \leq 0.25$, $0.25 \leq m \leq 1.5$, $0 \leq d \leq 1$, $-0.2 \leq e \leq 0.5$, $0 \leq f \leq 1$; wherein $0.5 \leq (L+m) \leq 1.5$ and $1.8 \leq \{(2+e)f+(2+e)(1-f)\} \leq 2.5$.

2. The method of claim 1, wherein the stabilizing component provided is selected from the group consisting of 1,3-propanedithiol and beta-mercaptoethanol.

3. The method of claim 1, wherein the additive provided is selected from the group consisting of 1,5-diazabicyclo[4.3.0]non-5-ene; 1,8-diazabicyclo[5.4.0]udec-7-ene; pyrrolidino-1-cyclohexene; pyrrolidone-1-cyclopentene; 1-methylimidazole; pyrazine and 2-methylpyrazine.

4. The method of claim 1, wherein the gallium carrier provided is selected from the group consisting of 1,3-diaminopropane; 1,2-diaminopropane; 2-methylpyrazine and mixtures thereof.

5. The method of claim 1, wherein the liquid carrier component provided is selected from the group consisting of a nitrogen containing solvent and miscible mixtures of nitrogen containing solvents.

6. The method of claim 1, wherein the liquid carrier component provided is a liquid amine having a formula $NR_3$, wherein each R is independently selected from the group consisting of a H, a $C_{1-10}$ alkyl group, a $C_{6-10}$ aryl group and a $C_{1-10}$ aminoalkyl group.

7. The method of claim 1, wherein the liquid carrier component provided is selected from the group consisting of ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1-amino-2-propanol; 1,3-diaminopropane; 1,2-diaminopropane; 1,2-diaminocyclohexane; pyridine; pyrrolidine; 1-methylimidazole; tetramethylguanidine and mixtures thereof.

8. The method of claim 1, wherein the molar ratio of selenium to copper to gallium plus optional indium is from 2:0.5:1 to 10:1.5:1.

* * * * *